United States Patent
Wu et al.

(10) Patent No.: US 6,646,316 B2
(45) Date of Patent: Nov. 11, 2003

(54) PACKAGE STRUCTURE OF AN IMAGE SENSOR AND PACKAGING

(75) Inventors: Jichen Wu, Hsinchu Hsien (TW); Hsiu Wen Tu, Hsinchu Hsien (TW); Kuo Feng Peng, Hsinchu Hsien (TW); C. H. Chen, Hsinchu Hsien (TW); Wen Chuan Chen, Hsinchu Hsien (TW)

(73) Assignee: Kingpak Technology, Inc., Hsinchu Hsien (TW)

( * ) Notice: Subject to any disclaimer, the term of this patent is extended or adjusted under 35 U.S.C. 154(b) by 103 days.

(21) Appl. No.: 09/770,049

(22) Filed: Jan. 24, 2001

(65) Prior Publication Data

US 2002/0096731 A1 Jul. 25, 2002

(51) Int. Cl.$^7$ .......................................... H01L 31/0203
(52) U.S. Cl. ...................... 257/434; 257/433; 257/59; 257/72; 257/80
(58) Field of Search ................................ 257/434, 435, 257/436, 417, 431, 424, 444, 668, 707, 433, 680, 68, 70, 72, 80, 687, 684, 59, 432; 357/70, 68; 438/123, 124, 613

(56) References Cited

U.S. PATENT DOCUMENTS

| | | | |
|---|---|---|---|
| 4,280,132 A | * 7/1981 | Hayakawa et al. | ........... 357/70 |
| 5,083,191 A | * 1/1992 | Ueda | ............................ 357/68 |
| 5,523,608 A | * 6/1996 | Kitaoka et al. | ............. 257/433 |
| 5,773,323 A | * 6/1998 | Hur | ............................ 438/123 |
| 5,786,239 A | * 7/1998 | Ohsawa et al. | ............. 438/123 |
| 5,825,081 A | * 10/1998 | Hosomi et al. | ............. 257/668 |
| 5,929,517 A | * 7/1999 | Distefano et al. | ........... 257/707 |
| 5,952,714 A | * 9/1999 | Sano et al. | .................. 257/680 |
| 6,011,294 A | * 1/2000 | Wetzel | ........................ 257/434 |
| 6,268,231 B1 | * 7/2001 | Wetzel | ........................ 438/116 |
| 6,307,256 B1 | * 10/2001 | Chiang et al. | .............. 257/668 |

* cited by examiner

Primary Examiner—David Nelms
Assistant Examiner—Long Tran
(74) Attorney, Agent, or Firm—Pro-Techtor International Services

(57) ABSTRACT

A package structure of an image sensor is characterized in that an image sensing chip is directly packaged on a flexible circuit board by way of flip chip bonding. The package structure of an image sensor includes an image sensing chip, a flexible circuit board, and a transparent layer. A plurality of electrical circuits are formed on the image sensing chip. Each of the electrical circuits is formed with bonding pads. A flexible circuit board has an upper surface and a lower surface. Signal input terminals are formed on the lower surface and at positions corresponding to each of the bonding pads of the image sensing chip, respectively, for electrically connecting to the corresponding bonding pads of the image sensing chip. The signal input terminals are electrically connected to signal output terminals, respectively, for electrically connecting to the printed circuit board. The transparent layer is used for covering the upper surface of the flexible circuit board. The image sensing chip receives image signals via the transparent layer, transforms the image signals into electrical signals, and transmits the electrical signals from the flexible circuit board to the printed circuit board.

2 Claims, 2 Drawing Sheets

PACKAGE STRUCTURE OF AN IMAGE SENSOR AND PACKAGING

BACKGROUND OF THE INVENTION

1. Field of the Invention

The invention relates to a package structure of an image sensor and method for packaging the same, and in particular, to a package structure of an image sensor, which is formed by way of flip chip bonding and capable of simplifying the manufacturing processes and lowering the manufacturing costs.

2. Description of the Related Art

A general sensor is used for sensing signals, which may be optical or audio signals. The sensor of the invention is used for receiving image signals and transforming the image signals into electrical signals which are transmitted to a printed circuit board.

Referring to FIG. 1, a conventional image sensor includes a substrate 10, a spacer 18, an image sensing chip 22, and a transparent glass 28.

The substrate 10 is made of ceramic materials. A plurality of signal input terminals 12 and signal output terminals 14 are formed on the periphery of the substrate 10. The signal output terminals 14 are used for electrically connecting the substrate 10 to a printed circuit board 16.

The spacer 18 is arranged on the substrate 10 to form a chamber 20 above the substrate 10.

The image sensing chip 22 is mounted on the substrate 10 and within the chamber 20 surrounded by the substrate 10 and the spacer 18. The substrate 10 is electrically connected to the image sensing chip 22 by a plurality of wirings 24 that electrically connects the bonding pads 26 of the image sensing chip 22 to the signal input terminals 12 of the substrate 10, respectively.

The transparent glass 28 is mounted on the spacer 18 so that the image sensing chip 22 can be protected and receive image or optical signals travelling through the transparent glass 28. The image signals are then transformed into electrical signals which are to be transmitted to the signal input terminals 12 of the substrate 10. The electrical signals are transmitted from the signal input terminals 12 of the substrate 10 to the signal output terminals 14, and then, from the signal output terminals 14 to the printed circuit board 16.

The above-mentioned package structure of the image sensor has a lot of elements and has a lot of complicated manufacturing processes. Moreover, since the substrate 10 is made of ceramic materials, the manufacturing costs are high. Furthermore, since the ceramic materials cannot be easily cut, the substrates 10 must be manufactured one by one, which also increases the manufacturing costs.

To solve the above-mentioned problems, it is necessary for the inventor to provide a package structure and method for an image sensor, in order to facilitate the manufacturing processes and to lower the manufacturing costs.

SUMMARY OF THE INVENTION

It is therefore an object of the invention to provide a package structure of an image sensor capable of reducing the number of package elements and lowering the package costs.

It is therefore another object of the invention to provide a method for packaging an image sensor, which is capable of simplifying and facilitating the manufacturing processes.

To achieve the above-mentioned objects, the invention is characterized in that the image sensing chip is directly packaged under the transparent layer by way of flip chip bonding. Thus, the substrate for signal transmission is no longer needed.

According to one aspect of the invention, a package structure of an image sensor is characterized in that an image sensing chip is directly packaged on a flexible circuit board by way of flip chip bonding. The package structure of an image sensor includes an image sensing chip, a flexible circuit board, and a transparent layer. A plurality of electrical circuits are formed on the image sensing chip. Each of the electrical circuits is formed with bonding pads. A flexible circuit board has an upper surface and a lower surface. Signal input terminals are formed on the lower surface and at positions corresponding to each of the bonding pads of the image sensing chip, respectively, for electrically connecting to the corresponding bonding pads of the image sensing chip. The signal input terminals are electrically connected to signal output terminals, respectively, for electrically connecting to the printed circuit board. The transparent layer is used for covering the upper surface of the flexible circuit board. The image sensing chip receives image signals via the transparent layer, transforms the image signals into electrical signals, and transmits the electrical signals from the flexible circuit board to the printed circuit board.

Thus, the manufacturing costs can be lowered and the manufacturing processes can be facilitated.

DETAIL DESCRIPTION OF THE INVENTION

Figure 1:
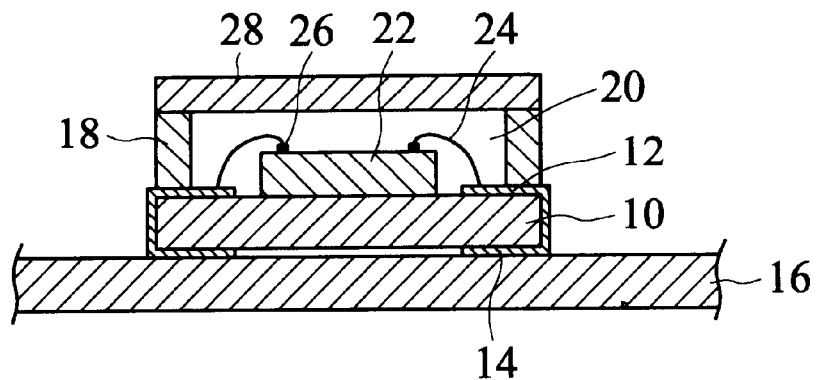
FIG. 1 is a cross-sectional view showing a conventional package structure of an image sensor.
Figure 2:
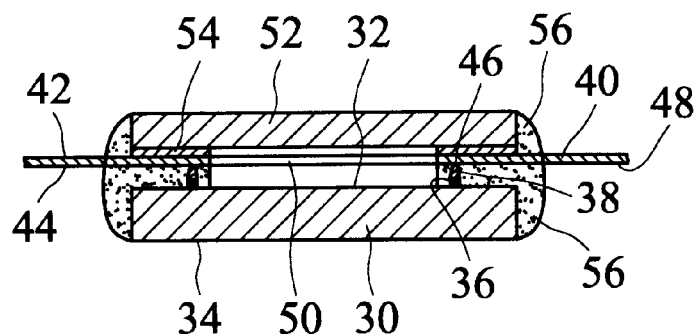
FIG. 2 is a cross-sectional view showing a package structure of an image sensor in accordance with the invention.

Referring to FIG. 2, the package structure of the image sensor in accordance with the invention includes an image sensing chip 30, a flexible circuit board 40, and a transparent layer 52.

The image sensing chip 30 has an upper surface 32 and a lower surface 34. A plurality of electrical circuits (not shown) are formed on the upper surface 32. Each of the electrical circuits is formed with bonding pads 36. Gold bumps 38 are formed on each of the bonding pads 36.

The flexible circuit board 40 has an upper surface 42 and a lower surface 44. Signal input terminals 46 are formed on the lower surface 44 and at the positions corresponding to the bonding pads 36 of the image sensing chip 30, respectively, for electrically connecting to the gold bumps 38 of the bonding pads 36 of the image sensing chip 30. Each of the signal input terminals 46 is electrically connected to the signal output terminals 48 formed on the lower surface 44 of the flexible circuit board 40. A slot 50 smaller than the image sensing chip 30 is formed at the central portion of the flexible circuit board 40. The signal input terminals 46 are arranged at the periphery of the slot 50. Thus, when electrical connecting the gold bumps 38 of the image sensing chip 30 to the signal input terminals 46 of the flexible circuit board 40, the image sensing chip 30 can be exposed to the outside via the slot 50.

The transparent layer 52 may be a transparent glass adhered onto the upper surface 42 of the flexible circuit board 40 for covering the slot 50 of the flexible circuit board 40. Thus, the image sensing chip 30 can receive image signals via the transparent layer 52 and transform the image signals into electrical signals.

Figure 3:
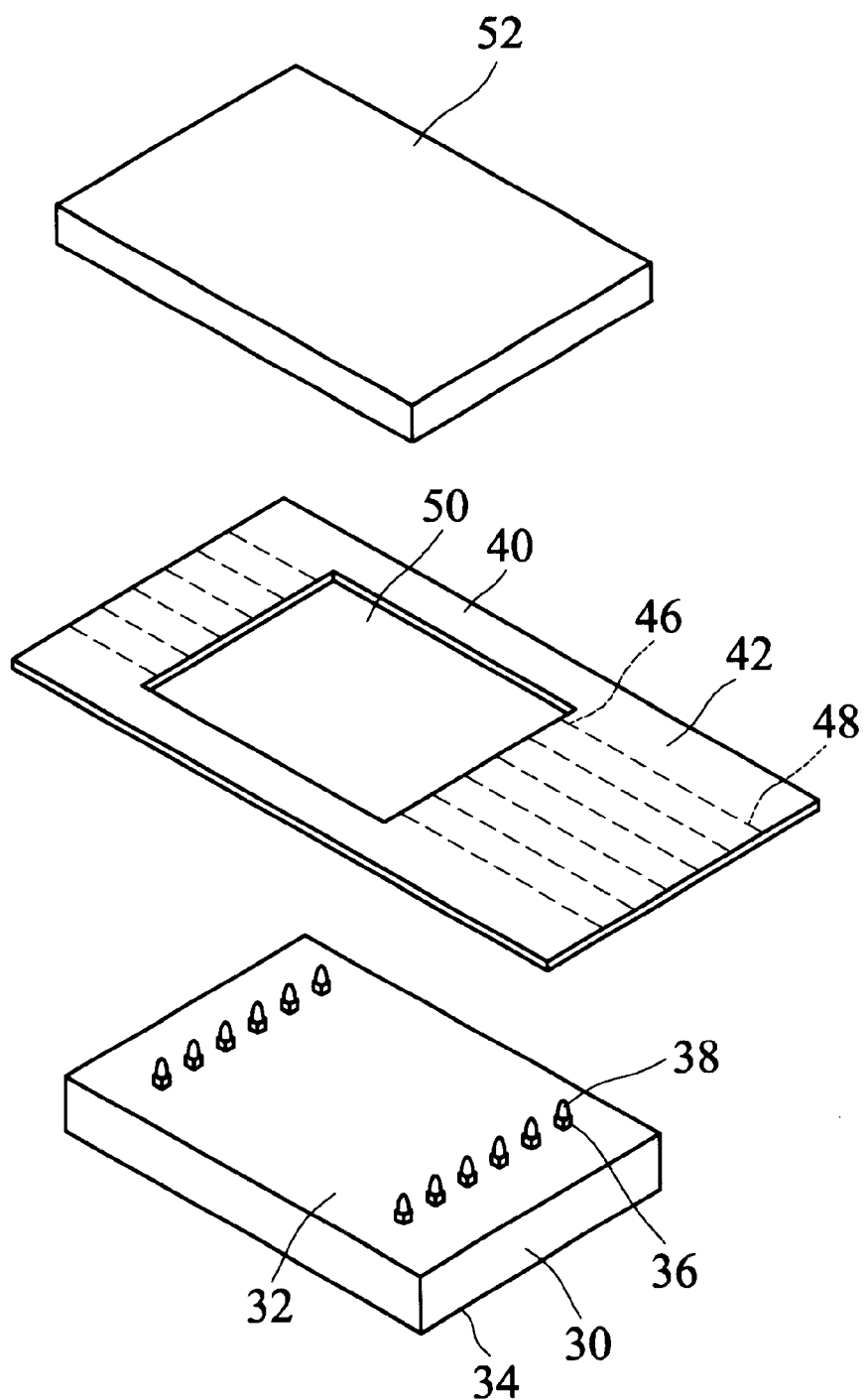
FIG. 3 is an exploded view showing the package structure of the image sensor in accordance with the invention.

As shown in FIG. 3, when packaging the image sensor of the invention, the image sensing chip 30 is firstly electrically connected to the flexible circuit board 40 by way of flip chip bonding. The gold bumps 38 can thus be electrically connected to the signal input terminals 46 of the flexible circuit board 40. Also, the gold bumps 38 can be adhered to the signal input terminals 46 by adhesive glue. Then, the transparent layer 52 is adhered onto the flexible circuit board 40 by adhesive glue 54. Thereafter, a glue layer 56 is used for filling the periphery between the image sensing chip 30 and the transparent layer 52 in order to seal the flexible circuit board 40 and the image sensing chip 30. Thus, the electrical connecting portion between the flexible circuit board 40 and the image sensing chip 30 can be protected. Consequently, image sensing chip 30 can receive image signals via the transparent layer 52, transform the image signals into electrical signals, transmit the electrical signals to the signal input terminals 46 of the flexible circuit board 40, and transmit the electrical signals from the signal input terminals 46 to the signal output terminals 48.

Figure 4:
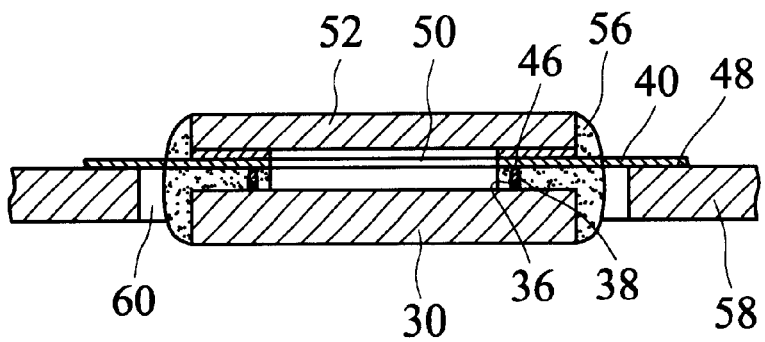
FIG. 4 shows the implementation of the package structure of the image sensor in accordance with the invention.

Referring to FIG. 4, the image sensor is placed within the notch 60 formed in the printed circuit board 58. The signal output terminals 48 of the flexible circuit board 40 are electrically connected to the printed circuit board 58. Thus, the image sensing chip 30 can receive image signals via the transparent layer 52, transform the image signals into electrical signals, transmit the electrical signals to the signal input terminals 36 of the flexible circuit board 40. Then, the electrical signals can be transmitted from the signal output terminals 48 of the flexible circuit board 40 to the printed circuit board 58.

The package structure and method of the image sensor of the invention have the following advantages.

1. Since the flexible circuit board 40 serves as the signal transmission medium for the image sensing chip 30, the conventional element such as the substrate 10 can be omitted so as to lower the manufacturing costs.
2. Since the conventional substrate 10 can be omitted, the image sensor can be made thin, small, and light.
3. Since the flexible circuit board 40 can be easily cut, a lot of image sensors can be packaged at the same time and cut into a lot of image sensors, thereby lowering the manufacturing costs.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A package structure of an image sensor for electrically connecting to a printed circuit board, comprising:

an image sensing chip on which a plurality of electrical circuits are formed, each of the electrical circuits being formed with bonding pads;

a flexible circuit board having an upper surface and a lower surface, a plurality of signal input terminals being formed on the lower surface and at positions corresponding to each of the bonding pads of the image sensing chip, respectively, for electrically connecting to the corresponding bonding pads of the image sensing chip, and the signal input terminals being electrically connected to signal output terminals, respectively, for electrically connecting the flexible circuit board to the printed circuit board; and a transparent layer for covering the upper surface of the flexible circuit board, wherein the image sensing chip receives image signals via the transparent layer, transforms the image signals into electrical signals, and transmits the electrical signals from the flexible circuit board to the printed circuit board, wherein the flexible circuit board is formed with a slot, the signal input terminals are formed at the periphery of the slot, and the image sensing chip is exposed to the outside via the slot when the flexible circuit board is electrically connected to the image sensing chip.

2. A package structure of an image sensor for electrically connecting to a printed circuit board formed with a notch, the package structure comprising:

an image sensing chip on which a plurality of electrical circuits are formed, each of the electrical circuits being formed with bonding pads;

a plurality of gold bumps arranged on the bonding pads;

a flexible circuit board having an upper surface and a lower surface, a plurality of signal input terminals being formed on the lower surface and at positions corresponding to each of the bonding pads of the image sensing chip, respectively, for electrically connecting to the corresponding bonding pads of the image sensing chip via the gold bumps, and the signal input terminals being electrically connected to signal output terminals formed on the lower surface of the flexible circuit board, respectively, for electrically connecting the flexible circuit board to the printed circuit board;

a transparent layer for covering the upper surface of the flexible circuit board, wherein the image sensing chip receives image signals via the transparent layer, transforms the image signals into electrical signals, and transmits the electrical signals from the flexible circuit board to the printed circuit board; and a glue layer for bonding and sealing the image sensing chip, the flexible circuit board, and the transparent layer together, wherein the flexible circuit board is placed on the printed circuit board with the image sensing chip received within the notch of the printed circuit board and with the transparent layer located above the notch of the printed circuit board.

* * * * *